United States Patent [19]

Tsumori

[11] Patent Number: 5,324,623
[45] Date of Patent: Jun. 28, 1994

[54] MICROLENS FORMING METHOD

[75] Inventor: Toshiro Tsumori, Kanagawa, Japan

[73] Assignee: Sony Corporation, Tokyo, Japan

[21] Appl. No.: 892,985

[22] Filed: Jun. 3, 1992

[30] Foreign Application Priority Data

Jun. 4, 1991 [JP] Japan ................... 3-161040

[51] Int. Cl.$^5$ ................................ G03F 7/00
[52] U.S. Cl. ................... 430/321; 427/162; 430/323; 430/324; 430/330; 430/394
[58] Field of Search ............ 427/162; 430/321, 323, 430/324, 330, 394

[56] References Cited

U.S. PATENT DOCUMENTS

| | | | |
|---|---|---|---|
| 4,689,291 | 8/1987 | Popovic et al. | 430/321 |
| 4,839,250 | 6/1989 | Cowan | 430/1 |
| 4,999,234 | 3/1991 | Cowan | 430/1 X |
| 5,230,990 | 7/1993 | Iwasaki et al. | 430/321 |

FOREIGN PATENT DOCUMENTS 0368482  5/1990  European Pat. Off. .

OTHER PUBLICATIONS

"Optical and Sub-Optical Imaging Technique Using Optical Imaging", *IBM Technical Disclosure Bulletin*, vol. 32, No. 5B, Oct. 1989, pp. 435–436.

Daly et al., "The Manufacture of Microlenses by Melting Photoresist", *Measurement Science and Technology*, vol. I, No. 8, pp. 759–766 (1990).

*Primary Examiner*—Michael Lusignan
*Attorney, Agent, or Firm*—Hill, Steadman & Simpson

[57] ABSTRACT

A method of forming a microlens made of a thermoplastic resin on a solid-state imaging device, including the steps of forming a resist pattern having an opening as a microlens forming portion on the solid-state imaging device; filling the opening with the thermoplastic resin; removing the resist pattern; and thermally deforming the thermoplastic resin on the opening. Accordingly, a microlens having a desired shape can be formed with a fine lens pattern of 0.5 μm or less uniformly and highly accurately.

6 Claims, 3 Drawing Sheets

MICROLENS FORMING METHOD

BACKGROUND OF THE INVENTION

The present invention relates to a method of forming a microlens made of a thermoplastic resin on a solid-state imaging device, and more particularly to a microlens forming method which can form a microlens made of a thermoplastic resin on a solid-state imaging device highly accurately even with a fine pattern of 0.5 μm or less.

As a method of forming a microlens on a solid-state imaging device with a relatively good position accuracy, it is known to directly form a lens made of a thermoplastic resin on the solid-state imaging device, thus obtaining a so-called on-chip lens. Various methods of forming such an on-chip lens made of a thermoplastic resin have been proposed. For example, in case of using a photoresist material for the thermoplastic resin, a negative type resist is used to obtain a high stability against light.

FIGS. 2A, 2B, 2C, and 2D show an example of the conventional method of forming a microlens. The forming method shown in FIG. 2 includes the steps of (a) laminating a negative type resist 2 and a positive type resist 3 in this order on a solid-state imaging device 1; (b) patterning the resists 2 and 3; (c) removing the positive type resist 3 as an upper layer; and (d) thermally deforming the negative type resist 2 on the solid-state imaging device 1 into a semispherical shape.

FIGS. 3A, 3B, and 3C show another example of the conventional method of forming a microlens. The forming method shown in FIG. 3 includes the steps of (i) patterning a positive type resist 3 on a negative type resist 2 formed on a solid-state imaging device 1; (ii) thermally deforming the patterned positive type resist 3 as an upper layer into a lens shape; and (iii) etching the resists 2 and 3 to transfer the lens shape of the positive type resist 3 as the upper layer to the negative type resist 2 as a lower layer.

According to a further known method, a microlens is formed by directly patterning the negative type resist rather than patterning the positive type resist as shown in FIG. 3 and then thermally deforming the patterned negative type resist into a semispherical shape.

However, in the case of patterning a negative type resist, an organic solvent is used as a developer, and a pattern of the negative type resist is formed by a cross-linking reaction. Accordingly, in a developing process, the pattern is swelled in the developer, so that the patterning with a high accuracy cannot be performed. As a result, it is difficult to form a fine pattern of about 0.5 μ and obtain a high resolution. For example, in case of patterning CMS (chloromethylated polystyrene) generally used as a far-ultraviolet ray negative type resist, a mixed solvent of xylene and MIBK is generally used as a developer. Also in this case, the pattern is swelled, and it is therefore difficult to form a pattern of even 1.0 μm. In contrast, a negative type resist having a high resolution has recently been put on the market. In general, such a negative type resist having a high resolution is a surface curing type resist. Accordingly, in the subsequent step of thermally deforming the patterned resist into a desired lens shape, the desired lens shape cannot be obtained.

Further, in the case of patterning the laminate of the negative type resist 2 and the positive type resist 3 as shown in FIG. 2, the negative type resist 2 is undercut as shown by a dotted line in step (b) of FIG. 2B in the etching process. Accordingly, in the subsequent thermal deforming step, a desired radius of curvature of the lens cannot be obtained.

Also in the case of transferring the lens shape of the positive type resist as the upper layer to the negative type resist as the lower layer as shown in FIG. 3, it is difficult to transfer the lens shape of the positive type resist to the negative type resist with a good repeatability because of ununiformity of the etching or the like.

Thus, it is difficult to form a microlens uniformly and highly accurately in the prior art methods. In particular, a fine lens pattern of 0.5 μm or less demanded by recent solid-stated imaging devices cannot be formed with a high accuracy in the prior art methods.

SUMMARY OF THE INVENTION

It is an object of the present invention to provide a method of forming a microlens made of a thermoplastic resin on a solid-state imaging device, which can form the microlens having a desired shape with a fine lens pattern of 0.5 μm or less uniformly and highly accurately.

According to the present invention, there is provided a method of forming a microlens made of a thermoplastic resin on a solid-state imaging device, comprising the steps of forming a resist pattern having an opening as a microlens forming portion on the solid-state imaging device; filling the opening with the thermoplastic resin; removing the resist pattern; and thermally deforming the thermoplastic resin on the opening.

According to the microlens forming method of the present invention, a microlens having a desired shape can be formed with a fine lens pattern of 0.5 μm or less uniformly and highly accurately.

Other objects and features of the invention will be more fully understood from the following detailed description and appended claims when taken with the accompanying drawings.

DETAILED DESCRIPTION OF THE PREFERRED EMBODIMENT

Figure 1A:
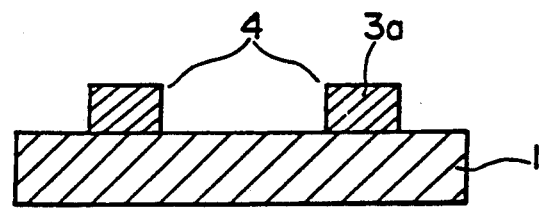
FIGS. 1A, 1B, 1C, 1D and 1E are sectional views illustrating a production process for a microlens according to a preferred embodiment of the present invention.

There will now be described the microlens forming method of the present invention in detail with reference to the drawing. In the drawing, the same reference numerals designate the same or like elements.

Figure 1B:
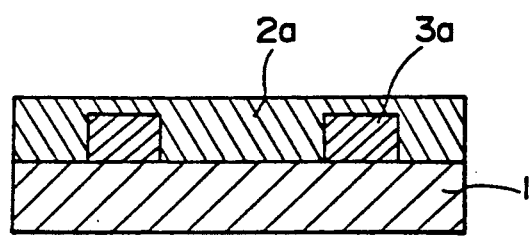
Figure 1C:
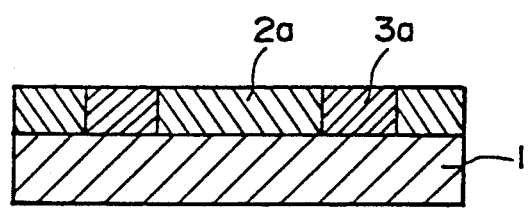
Figure 1D:
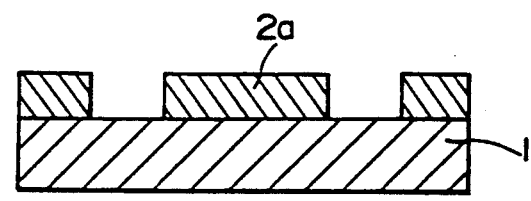
Figure 1E:
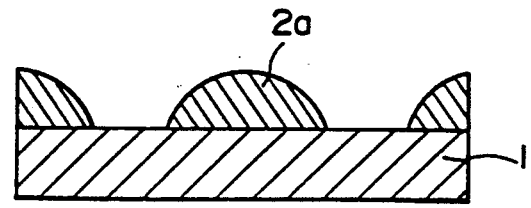
Figure 2A:
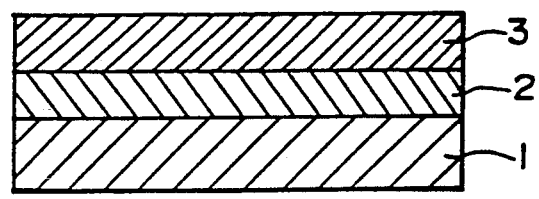
FIGS. 2A, 2B, 2C and 2D are sectional views illustrating a production process for a microlens in the prior art.
Figure 2B:
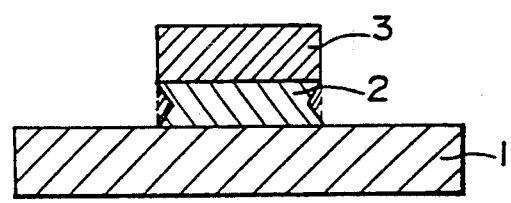
Figure 2C:
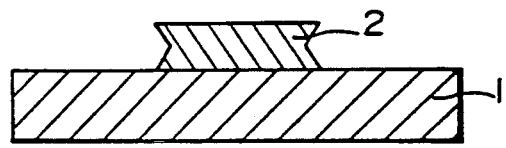
Figure 2D:
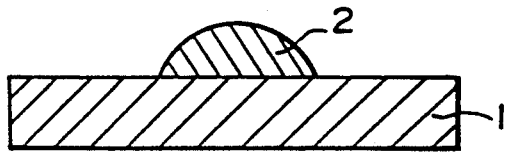
Figure 3A:
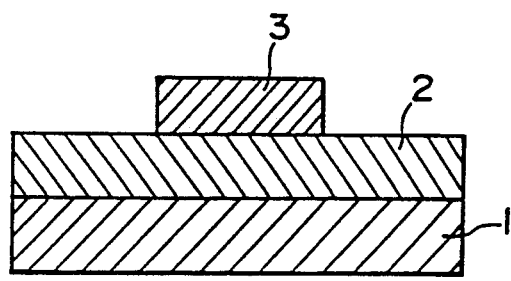
FIGS. 3A, 3B and 3C are sectional views illustrating another production process for a microlens in the prior art.
Figure 3B:
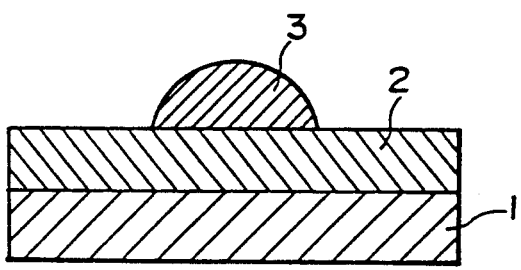
Figure 3C:
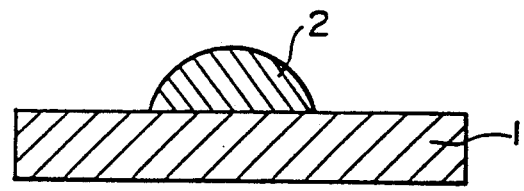

FIG. 1 illustrates a production process for a microlens according to a preferred embodiment of the present invention.

In the microlens forming method according to the preferred embodiment, as a first step, a resist 3a is coated on a solid-state imaging device 1 as a base, and the resist 3a thus coated is patterned so as to form an opening 4 as a microlens forming portion (step (A)). It is preferable to use a positive type resist as the resist 3a to be used in such resist patterning. Particularly in case of obtaining a fine pattern, it is preferable to use an i-ray positive type resist or the like having a high resolution. Such resist patterning may be carried out by an ordinary lithography.

On the solid-state imaging device 1 as the base for the resist patterning, there may be formed as required a protective film, a transparent material layer for flattening a surface of the solid-state imaging device or adjusting a focal distance of the lens, or a color filter for a color solid-state imaging device, for example.

Secondly, a thermoplastic resin 2a is coated over the pattern of the resist 3a (step (B)). Then, the thermoplastic resin 2a thus coated is etched back until an upper surface of the resist 3a is exposed, thereby filling the opening 4 of the pattern of the resist 3a with the thermoplastic resin 2a (step (C)). As will be hereinafter described, the thermoplastic resin 2a thus filled in the opening 4 is to be thermally deformed to form the lens. Therefore, a thermoplastic resin capable of sufficiently flowing by heat is used as the thermoplastic resin 2a. Further, the thermoplastic resin 2a is preferably made of a material having a high stability against light and a certain light transmittance according to applications of the solid-state imaging device. For example, a negative type resist having a transparency for a visible light may be used.

As mentioned above, the opening 4 of the pattern of the resist 3a is filled with the thermoplastic resin as shown by step (C) by coating the thermoplastic resin 2a over the pattern of the resist 3a and then etching back the thermoplastic resin 2a. However, the process of filling the opening 4 with the thermoplastic resin 2a is not limited to the above so far as the opening 4 may be filled with the thermoplastic resin 2a. For example, the thermoplastic resin 2a may not cover the pattern of the resist 3a in the initial stage, but the opening 4 of the pattern of the resist 3a may be initially filled with the thermoplastic resin 2a.

After filling the opening 4 of the pattern of the resist 3a with the thermoplastic resin 2a, the pattern of the resist 3a is removed (step (D)). A method of removing the resist pattern may be such that in case of using a positive type resist as the resist 3a, a whole surface of the resist pattern as well as the thermoplastic resin is exposed to light having a wavelength capable of sensitizing the positive type resist, and is then developed. In this case, if a negative type resist is used as the thermoplastic resin 2a as mentioned above, the reaction proceeds in such a manner that the negative type resist is not dissolved in a developer, thus providing great advantage in the process.

Finally, the thermoplastic resin 2a left on the solid-state imaging device 1 is heat-treated to be deformed into a substantially semispherical lens (step (E)).

In this way, the microlens made of the thermoplastic resin 2a is formed on the solid-state imaging device 1 with a high accuracy.

In the microlens forming method according to the present invention, a resist having a high resolution such as a positive type resist is used in patterning of the lens, and the patterning is performed so that an opening is formed as a microlens forming portion. Accordingly, it is possible to let a negative type resist or the like having a low resolution not take part in the patterning of the lens, so that a fine pattern of the lens can be formed with a high accuracy.

Furthermore, the formation of the spherical shape of the lens is carried out by filling the opening of the resist pattern with the thermoplastic resin of a negative type resist or the like and then thermally deforming the thermoplastic resin. Accordingly, the transfer of the spherical shape of the lens by etching as in the conventional method can be eliminated to thereby improve the uniformity of the shape of the microlens.

Thus, according to the microlens forming method of the present invention, it is possible to form a lens with a fine pattern of 0.5 $\mu$m or less uniformly and highly accurately.

The present invention will be more clearly understood with reference to the following example.

An i-ray positive type resist (NPR-A18SHI manufactured by Nagase Denshikagaku) was coated with a thickness of 1 $\mu$m on a solid-state imaging device as a base. Then, as shown by step (A) in FIG. 1, the resist was patterned by photolithography in such a manner that an opening having a diameter of 5 $\mu$m was formed as a microlens forming portion with a spacing between the adjacent openings set to 0.5 $\mu$m. In the photolithography, FPA-2000iI (manufactured by Canon) was used as an exposure device, and TMAH (2.38%) was used as a developer to carry out dip developing for one minute.

Then, CMS (chloromethylated polystyrene) as a negative type resist was coated with a thickness of 1.2 $\mu$m by spin coating, and was then baked to cover the pattern of the i-ray positive type resist as shown by step (B) in FIG. 1.

Then, the CMS was etched back (etching conditions: $O_2$RIE, 0.3 Torr, one minute) to expose an upper surface of the i-ray positive type resist as shown by step (C) in FIG. 1.

Then, the whole surface of the positive and negative type resists was exposed to light and developed to thereby remove the pattern of the i-ray positive type resist as shown by step (D) in FIG. 1. In this case, PLA-521F (manufactured by Canon) was used as an exposure device to carry out exposure of light having a wavelength of 300–400 nm for 10 seconds. Further, TMAH (2.38%) was used as a developer.

Then, the CMS left on the solid-state imaging device was heat-treated at 150° C. for 20 minutes, so that the CMS thermally flowed to be formed into a microlens having a desired shape.

As the result, the microlens having a diameter of 5 $\mu$m was formed on the solid-state imaging device with a fine lens pattern of 0.5 $\mu$m in lens spacing uniformly and highly accurately.

While the invention has been described with reference to a specific embodiment, the description is illustrative and is not to be construed as limiting the scope of the invention. Various modifications and changes may occur to those skilled in the art without departing from the spirit and scope of the invention as defined by the appended claims.

What is claimed is:

1. A method of forming a microlens on a solid-state imaging device, comprising the steps of:
   coating a positive photoresist film on said solid-state imaging device;
   patterning said photoresist film to form an opening therein;
   filling said opening with a thermoplastic resin;
   then removing said photoresist film; and
   then heating said thermoplastic resin left in said opening to deform said thermoplastic resin into said microlens.

2. A method according to claim 1, wherein said step of filling said opening with said thermoplastic resin comprises the steps of applying a coating of said thermoplastic resin of a thickness to fill the openings and to cover said photoresist film formed with said opening and then etching back a portion of said coating of said thermoplastic resin until said photoresist film is exposed.

3. The method as defined in claim 1, wherein a negative resist is employed for said thermoplastic resin.

4. The method as defined in claim 1, wherein said step of removing said photoresist film comprises the steps of exposing a whole surface of said photoresist film to light and developing said exposed photoresist film to thereby remove said positive photoresist.

5. A method of forming a microlens on a surface of a solid-state imaging device, said method comprising the steps of:

applying a positive photoresist film on the surface of the solid-state imaging device;

patterning the positive photoresist film to form an opening therein;

applying a second coat of a negative resist on the photoresist film to fill the opening and to cover the film;

etching a portion of the coating of negative resist to uncover the photoresist film;

then exposing the device to light to transform the positive photoresist film into an exposed photoresist film;

then removing the exposed photoresist film by developing to leave the negative resist filling the opening; and then heating the negative resist to deform the negative resist into a microlens.

6. A method according to claim 5, wherein the negative resist is a thermoplastic resin.

* * * * *